US006929991B2

(12) United States Patent
Mikata et al.

(10) Patent No.: US 6,929,991 B2
(45) Date of Patent: Aug. 16, 2005

(54) RELIABLE SEMICONDUCTOR DEVICE AND METHOD OF MANUFACTURING THE SAME

(75) Inventors: Yuuichi Mikata, Yokohama (JP); Shuji Katsui, Yokohama (JP); Hiroshi Akahori, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 8 days.

(21) Appl. No.: 10/775,065

(22) Filed: Feb. 11, 2004

(65) Prior Publication Data

US 2004/0155271 A1 Aug. 12, 2004

Related U.S. Application Data

(62) Division of application No. 09/459,913, filed on Dec. 14, 1999, now Pat. No. 6,713,824.

(51) Int. Cl.[7] ............................................... H01L 21/00
(52) U.S. Cl. ...................... 438/197; 438/198; 438/257; 438/585
(58) Field of Search ................................ 438/197, 198, 438/257, 585, 452, 439, 308; 257/407, 412

(56) References Cited

U.S. PATENT DOCUMENTS

| | | | |
|---|---|---|---|
| 4,295,265 A | 10/1981 | Horiuchi et al. | |
| 4,745,079 A | 5/1988 | Pfiester | |
| 4,745,088 A | 5/1988 | Inoue et al. | |
| 4,910,163 A | 3/1990 | Jain | |
| 5,150,178 A | 9/1992 | Mori | |
| 5,354,702 A | 10/1994 | Arima et al. | |
| 5,360,756 A | 11/1994 | Tamura | |
| 5,753,134 A | 5/1998 | Biebl | |
| 5,759,883 A | 6/1998 | Kinoshita | |
| 5,767,004 A | 6/1998 | Balasubramanian et al. | |

(Continued)

FOREIGN PATENT DOCUMENTS

| | | | | |
|---|---|---|---|---|
| EP | 1017089 A2 | * | 7/2000 | ............ H01L/21/28 |
| JP | 3-62-033470 | | 2/1987 | |
| JP | 3-62-037160 | | 2/1987 | |
| JP | 63042174 | | 2/1988 | |
| JP | 03163874 | | 7/1991 | |
| JP | 08321612 | | 12/1996 | |
| JP | 9-246206 | | 9/1997 | |
| JP | 2002353458 A | * | 12/2002 | ............ H01L/29/786 |

OTHER PUBLICATIONS

Miura, H. et al., "Effect of Mechanical Stress on Reliability of Gate–Oxide Film in MOS Transistors", International Electron Devices Meeting, Technical Digest (Cat. No. 96CH35961), San Francisco, CA, pp. 743–746, Dec. 1996.

Hamada et al., A New Aspect on Mechanical Stress Effects in Scaled MOS Devices, 1990, IEEE, Symposium on VLSI Technology, pp. 113–114.

Hamada et al., Hot–Electron Trapping Activation Energy in PMOSFET's Under Mechanical Stress, Jan. 1994, IEEE, Electron Device Letters, vol. 15, No. 1, pp. 31–32.

*Primary Examiner*—Laura M Schillinger
(74) *Attorney, Agent, or Firm*—Finnegan, Henderson, Farabow, Garrett & Dunner, L.L.P.

(57) ABSTRACT

The present invention provides a semiconductor device and a method of manufacturing the same improved in reliability of a gate insulating film by increasing a total charge amount Qbd by suppressing a film stress of a gate electrode formed of a polysilicon film, to a low value. Since the film stress is closely related to a film formation temperature, it is possible to reduce the film stress lower than the conventional case by forming a film at as a high temperature as 640° C. or more. At this time, when the film stress decreases, the total charge amount Qbd regulating dielectric breakdown of the film increases, improving reliability of the gate insulating film. It is therefore possible to set the film stress of the gate electrode at 200 MPA or less in terms of absolute value by forming the gate electrode at 640° C. or more.

10 Claims, 5 Drawing Sheets

U.S. PATENT DOCUMENTS

| | | | |
|---|---|---|---|
| 5,786,027 A | | 7/1998 | Rolfson |
| 5,831,694 A | * | 11/1998 | Onisawa et al. ............... 349/43 |
| 5,990,517 A | | 11/1999 | Irino |
| 5,999,236 A | | 12/1999 | Nakajima et al. |
| 6,069,061 A | | 5/2000 | Lin et al. |
| 6,118,140 A | | 9/2000 | Nakamima et al. |
| 6,326,284 B1 | * | 12/2001 | Miura et al. ................ 438/452 |
| 6,713,824 B1 | * | 3/2004 | Mikata et al. ............... 257/407 |
| 2002/0019146 A1 | * | 2/2002 | Miura et al. ................. 438/787 |
| 2003/0181005 A1 | * | 9/2003 | Hachimine et al. ......... 438/231 |
| 2004/0029323 A1 | * | 2/2004 | Shimizu et al. ............. 438/142 |
| 2004/0075148 A1 | * | 4/2004 | Kumagai et al. ............ 257/369 |
| 2004/0155271 A1 | * | 8/2004 | Mikata et al. ............... 257/288 |
| 2004/0217448 A1 | * | 11/2004 | Kumagai et al. ........... 257/627 |

* cited by examiner

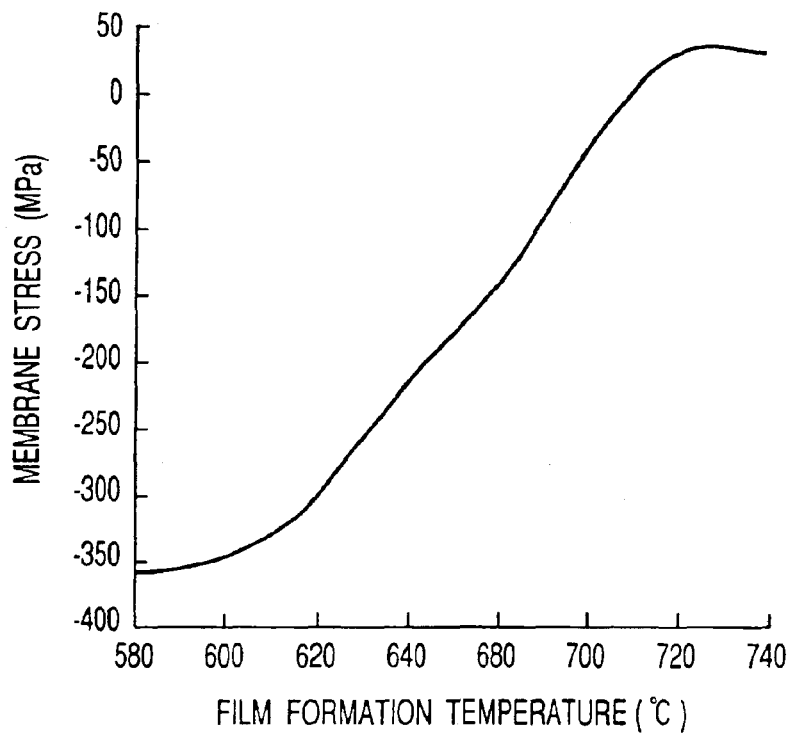
F I G. 3
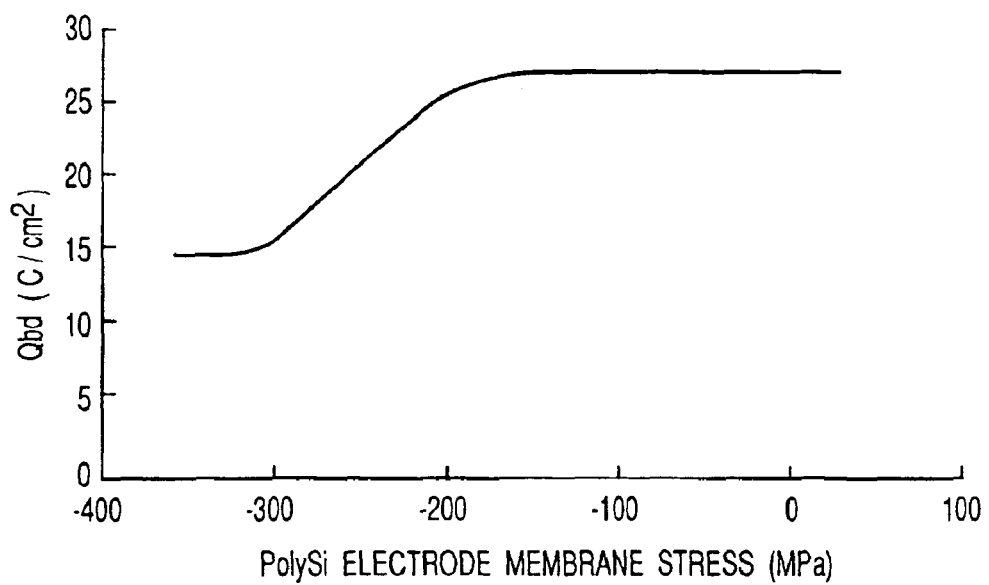
F I G. 6

RELIABLE SEMICONDUCTOR DEVICE AND METHOD OF MANUFACTURING THE SAME

This is a division of Application No. 09/459,913, filed Dec. 14, 1999 now U.S. Pat. No. 6,713,824, which is incorporated herein by reference in its entirety.

BACKGROUND OF THE INVENTION

The present invention relates to a semiconductor device constituted of an integrated circuit having a MOS transistor formed therein, and more particularly, to a method of forming a gate electrode for improving reliability of a gate insulating film of the MOS transistor.

Now, we will explain steps of manufacturing the MOS transistor which serves as a constitutional element of an integrated circuit formed on a conventional semiconductor substrate, by taking an NMOS transistor having an LDD (lightly doped drain) structure, as an example. First, an element isolating region 2 is formed on a surface region of a p-type silicon semiconductor substrate 1 by a LOCOS method or the like. A gate insulating film ($SiO_2$) 3 is formed on an element region surrounded by the element isolating region 2. Then, boron ions are injected (channel ion injection) over an entire main surface of the semiconductor substrate 1 to control a threshold voltage (FIG. 9A). Subsequently, a polysilicon film is deposited over the entire main surface of the semiconductor substrate 1 and patterned to form a gate electrode 4 of polysilicon (PolySi) on the gate insulating film 3 in the element region. Thereafter, P (phosphorus) ions are injected in a low amount to form an $n^-$ source/drain region 5 for mitigating a high electric field (FIG. 9B).

Next, a silicon oxide film ($SiO_2$) 6 is deposited on the semiconductor substrate 1 by a CVD (Chemical Vapor Deposition) method or the like so as to cover the gate electrode 4 (FIG. 10A). Subsequently, the silicon oxide film 6 is anisotoropically etched to form a side wall insulating film 7 on a side wall of the gate electrode 4. Thereafter, n-type impurity ions such as arsenic (As) ions are doped in a high amount to form an $n^+$ source/drain region 8 (FIG. 10B).

As described above, in the MOS transistor, a polysilicon film doped with phosphorus, arsenic, or boron is generally used as the gate electrode. The polysilicon film is deposited by an LPCVD method at a reaction-chamber ambient temperature of about 600° C. The polysilicon film deposited under the aforementioned conditions has a film stressfilm stress of 300 MPa or more despite the presence or absence of a dopant. Such a high stress of the gate electrode is applied to a gate insulating film (in this prior art, the film may be composed of a silicon oxide film, hereinafter simply called "gate insulating film", for the simplicity of explanation) whereby the high stress affects reliability of the gate insulating film or gate insulating film formed under the gate electrode. To explain more specifically, when the stress is applied to the gate insulating film, the bonding between silicon and oxygen constituting the gate insulating film is distorted. As a result, the bonding is tend to be easily broken, readily inducing dielectric breakdown of the gate insulating film.

When intrinsic dielectric breakdown of the insulating film takes place, the total amount Qbd of electric charge passing through the insulating film is up to about 15 C/cm² under application of an electric field of 12 MV/cm to the insulating film, assuming that the thickness of the insulating film is about 10 nm. The total charge amount Qbd is a value on the basis of which the reliability of a transistor is determined. Therefore, the Qbd desirably has a large value. Particularly, in non-volatile storage device, such as EEPROM (Electrically Erasable Programmable Read Only memory) in which data is written into a memory cell by using a tunnel current, how many times can be programmed is restricted by the total charge amount Qbd. Therefore, it is necessary to increase the total charge amount Qbd in order to improve performance of the device.

BRIEF SUMMARY OF THE INVENTION

The present invention was made in view of the aforementioned circumstances. The present invention provides a semiconductor device and a method of manufacturing the same, improved in reliability of a gate insulating film and increased in its total charge amount Qbd by suppressing a film stressfilm stress of a gate electrode formed of a polysilicon film, to a low value.

Since the film stressfilm stress of a gate electrode is closely related with a film formation temperature, it is possible to reduce the film stressfilm stress lower than in the conventional case, by forming a film at as a high temperature as 640° C. or more, preferably 650° C. or more. With a decrease in the film stress of the gate electrode at this time, the total charge amount Qbd of a gate insulating film underlying the gate electrode increases, with the result that reliability not only of the gate insulating film but also a semiconductor device including the gate insulating film is improved.

More specifically, the semiconductor device of the present invention comprises a semiconductor substrate;

source/drain regions formed on the semiconductor substrate;

a gate insulating film formed between the source/drain regions on the semiconductor substrate; and a gate electrode formed on the gate insulating film, in which a film stress of the gate electrode is 200 MPa or less in terms of absolute value.

The gate electrode may be a polysilicon film and may be in contact with the gate insulating film.

A metal silicide film or a high-melting point metal film may be formed on the polysilicon film. In other words, the gate electrode may be formed of the polysilicon film and the metal silicide film or the high melting point metal film. Furthermore, the high melting point metal film is formed on the metal silicide film, and therefore, the gate electrode may be formed of the polysilicon film, the metal silicide film, and the high melting point metal film.

A MOS transistor having the source/drain regions, the gate insulating film, and the gate electrode, may be adopted in a non-volatile semiconductor storage device such as an EEPROM. When the MOS transistor according to the invention is used in an EEPROM, the programmable number can be increased since a total charge amount Qbd of electric charge passing through the gate insulating film serving as a floating gate has a direct effect upon characteristics of a device.

According to the present invention, there is provided a method of manufacturing a semiconductor device, according to the present invention comprises the steps of:

forming source/drain regions in a semiconductor substrate;

forming a gate insulating film between the source/drain regions on the semiconductor substrate; and forming a gate electrode including a polysilicon film on the gate insulating film and having a film stress of 200 MPa or less;

in which the polysilicon film is formed by depositing polysilicon on the gate insulating film by a CVD method at a temperature of 640° C. or more. Preferably, the temperature at which a gate insulating film is formed may be 650° C. or more, in order to stably provide a gate electrode whose film stress is 200 MPa or less.

The polysilicon film may be formed while the semiconductor substrate is rotated at a high speed. In this manner, it is possible to form a uniform film on a semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a characteristic graph showing the relationship between deposition temperature of a polysilicon film and film stress;

FIG. 6 is a characteristic graph showing the relationship between the film stress of the polysilicon film and the total charge amount of a gate insulating film;

DETAILED DESCRIPTION OF THE INVENTION

Now, embodiments of the present invention will be explained with reference to the accompanying drawings.

First, referring to FIGS. 1 to 6, a first embodiment will be explained.

Figure 1:
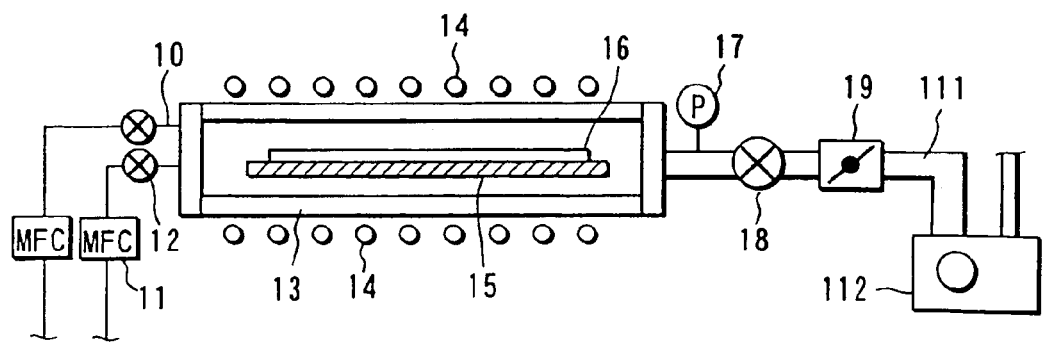
FIG. 1 is a schematic sectional view of a single-wafer processing LPCVD apparatus used in a first embodiment.

FIG. 1 is a schematic sectional view of a single-wafer processing LPCVD (Low pressure CVD) apparatus.

Figure 2:
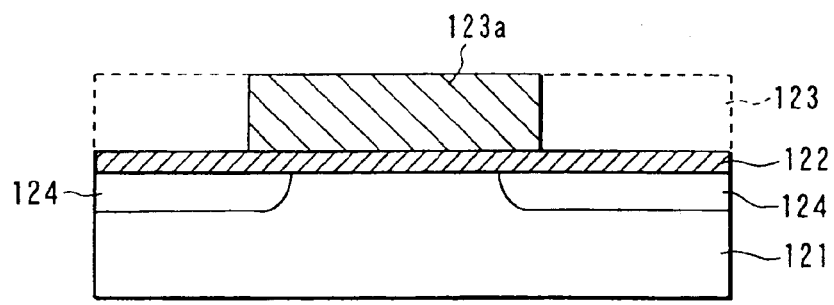
FIG. 2 is a cross-sectional view of a semiconductor substrate having a MOS capacitor according to the present invention.

FIG. 2 is a cross sectional view of a MOS capacitor formed on a semiconductor substrate. FIG. 3 is a characteristic graph showing dependency of the film stress (MPa) of the polysilicon film on the semiconductor substrate upon deposition temperature. FIGS. 4A to 5B are conceptual diagram explaining the way of measuring a film stress. FIG. 6 is a characteristics graph showing a total charge amount Qbd (C/cm$^2$) of the gate insulating film.

As shown in FIG. 1, the LPCVD apparatus has a reaction chamber 13 (hereinafter, referred to as "film formation chamber"). The film-formation chamber 13 is equipped with a susceptor 15 on which a semiconductor wafer 16 is mounted. The inner space of the film formation chamber 13 is heated by a plurality of infrared lamps 14 arranged around the chamber in close proximity thereto, during film formation time. A reactive gas is supplied from a pipe 10 to the inner space of the film formation chamber 13 while being controlled by a mass-flow controller 11 and a valve 12. After completion of a reaction, an exhaust gas is discharged by a pump 112 through a pipe 111. The pump 112 is controlled by a valve 18 and a conductance valve 19 while the pressure is monitored by a pressure gage 17 attached to the pipe 111.

As shown in FIG. 2, a thermal oxidation film serving as a gate insulating film 122 and formed on a silicon semiconductor substrate 121 is oxidized with $O_2$, $H_2O$, or HCl gas at a temperature of 800° C. to render the thickness at 8 nm. Thereafter, the semiconductor substrate 121 (semiconductor wafer 16) is placed in the film-formation chamber 13 of the LPCVD apparatus shown in FIG. 1. Then, a polysilicon film 123 is formed on the semiconductor wafer 16 in a thickness of about 200 nm at a film-formation temperature of 680° C. and a pressure of 5 Torr while $SiH_4$ gas is supplied at a flow rate of 1 SLM and $AsH_3$ gas at a flow rate of 1 sccm. At this time, the concentration of As in the polysilicon film 123 is about 1×10$^{20}$ atoms/cm$^3$. Thereafter, the polysilicon film 123 is annealed for 30 minutes at 900° C. under an $N_2$ atmosphere in order to activate a dopant. Thereafter, a photoresist (not shown) is coated onto the polysilicon film 123 and photolithographically patterned. The polysilicon film 123 is further subjected to dry etching in accordance with anisotropic etching such as RIE (Reactive Ion Etching) to form the gate electrode 123a. Finally, a capacitor of a layered structure: a gate electrode—gate insulating film—a semiconductor substrate, was formed. Then, electric characteristics of the gate insulating film were examined by using the capacitor. In this embodiment, the gate electrode 123 a is formed of polysilicon film 123, but the material of the gate electrode according to the present invention is never limited to a polysilicon, as being explained later. In the case that a device according to the present invention is actually fabricated, source/drain regions 124 are formed in the semiconductor substrate 121. However, in the case of examining the electric characteristics of gate insulating film, the formation of source/drain regions 124 is omitted since they are unnecessary in the above examination. The gate electrode 123a may also be formed of at least one of a metal silicide film and a high-melting point metal film.

FIG. 3 shows the relation between a deposit temperature of a polysilicon film (gate electrode) and a film stress. In FIG. 3, the longitudinal axis indicates a film stress (MPa) of the polysilicon film on the semiconductor substrate, and the lateral axis indicates the film formation temperature (° C.) of the polysilicon film. The polysilicon films were formed by deposited on the substrate in the same manner under the same conditions as in the aforementioned steps for manufacturing a capacitor, except the film formation temperature, that is, by varying the film formation temperature, and then annealing the polysilicon film, whereby obtaining various semiconductor wafers having capacitors of various electric characteristics. Thereafter, the stress of the polysilicon film alone was checked on the basis of warpage of the semiconductor wafer.

The stress of the polysilicon film itself was measured as follows.

Figure 4A:
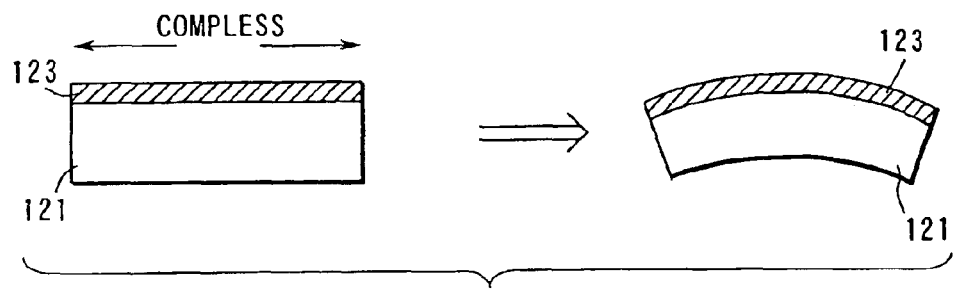
FIGS. 4A and 4B show that a semiconductor substrate is bent by a compression stress or tensile stress generated in a gate electrode (polysilicon film)
Figure 4B:
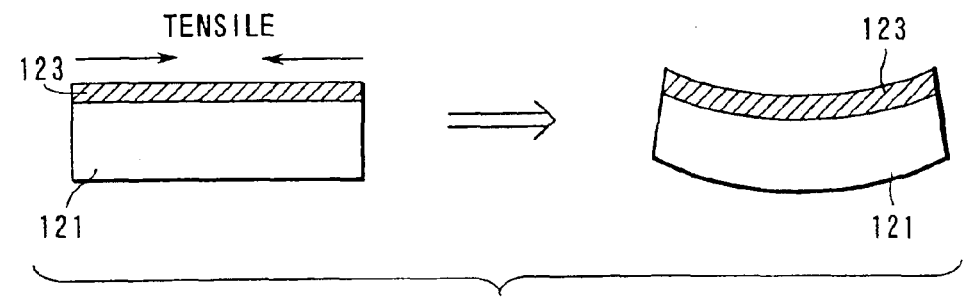

Generally, compressive stress or tensile stress is generated in the polysilicon film, depending upon a deposition temperature of the polysilicon film. When the compressive stress is generated, "upward warpage" bent is produced, as shown in FIG. 4A. On the other hand, when the tensile stress is generated, "downward warpage" bent is produced, as shown in FIG. 4B. Hereinafter, the "upward warpage" bent will be expressed by a positive value, whereas the "downward warpage" bent by a negative value.

Figures 5A, 5B:
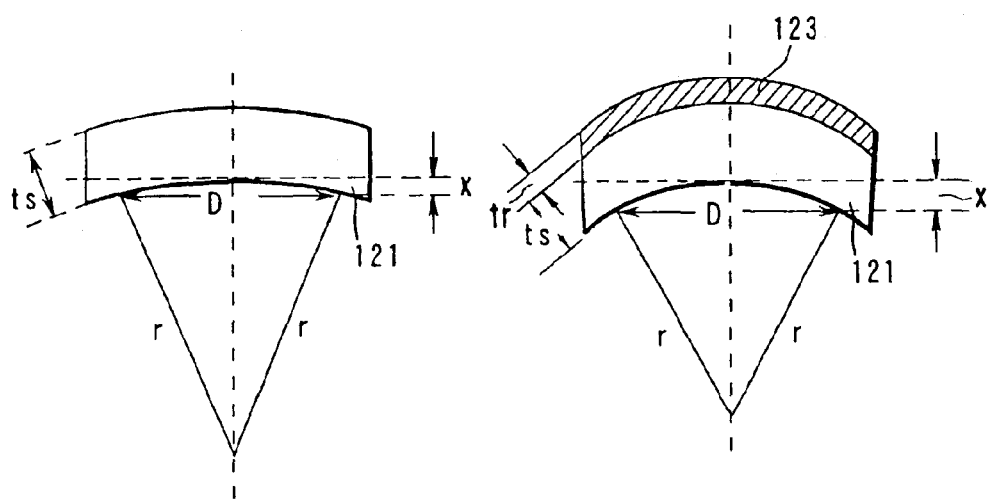
FIGS. 5A and 5B are conceptual diagram for explaining how a bent amount is calculated, FIG. 5A relates to the situation prior to the formation of a polysilicon film on the silicon substrate, and FIG. 5B relates to the situation after the formation of a polysilicon film on the silicon substrate.

FIGS. 5A and 5B are conceptual views showing how to obtain a warpage amount, arithmetically. FIG. 5A shows a state before the polysilicon film is deposited on a substrate. FIG. 5B shows a state after the polysilicon film is deposited on the substrate. In the figures, reference symbol ts denotes a thickness of a substrate, tr is a thickness of the deposited film (polysilicon film), D is a diameter of the portion at which warpage is measured (corresponding to the warpage), and X is a warpage amount ($\mu$m).

The film stress $\sigma$ may be arithmetically obtained in accordance with a general equation for stress:

$$\sigma = \frac{E_s}{6(1-\gamma_s)} \cdot \frac{(t_s)^2}{t_r} \cdot \frac{1}{r}$$

where $\sigma$ is a film stress, Es is a Young's modulus of a substrate (semiconductor wafer), and $\gamma_s$ is a Poisson's ratio of the substrate.

Herein, from the following Equation I:

$$r = \frac{X^2 + (D/2)^2}{2X} \approx \frac{(D/2)^2}{2X} = \frac{D^2}{8X} \quad (I)$$
$$\because X \ll r$$

Equation II is deduced.

$$\sigma = \frac{E_s}{6(1-\gamma_s)} \cdot \frac{(t_s)^2}{t_r} \cdot \frac{1}{r} \approx \frac{E_s}{6(1-\gamma_s)} \cdot \frac{(t_s)^2}{t_r} \cdot \frac{8X}{D^2} \quad (II)$$

Accordingly, stress $\sigma$ is obtained on the basis of the warpage amount X. As mentioned before, since a "upward warpage" is defined as a positive value, and a "downward warpage" a negative value, a film stress in the case of "upward warpage" has a positive value, while a film stress in the case of a "downward warpage" has a negative value.

The film stress of the polysilicon film alone is defined as the difference in warpage amount before and after the polysilicon film is deposited, as being illustrated in FIGS. 5A and 5B. The warpage amount is measured by using Flexsus FLX-2418 (manufactured by KLA Tencor Corporation), as a measuring device.

Referring again to FIG. 3, it has been found that the film stress is as small as 50MPa (absolute value) or less at a deposition temperature of 700° C. or more. As the film formation temperature decreases from 700° C., a compressive stress is expressed, while a tensile stress reaches as large as −300 MPa at near 620° C. On the other hand, the stress immediately after the polysilicon film is formed, is 100 MPa or less. This value does not so significantly differ from that obtained after the annealing.

FIG. 6 shows the results of a total charge amount Qbd of the gate insulating film measured under an electric field of 12 MV/cm, in the MOS capacitor thus formed on the semiconductor substrate. Note that the total charge amount Qbd is defined as the total amount of electric charge passing through the capacitor per unit area when a plurality of capacitors formed in the same plane of the semiconductor wafer are measured and a failure rate thereof reaches 50%.

In the case where the film stress is smaller than −300 MPa, the total amount of the electric charge Qbd is about 15 C/cm$^2$. However, in the case where the film stress ranges from −200 MPa to about +30MPa, the total charge amount Qbd is as large as 25 C/cm$^2$ or more. This means that the total charge amount of the gate insulating film 122 is 25 C/cm$^2$ or more when the polysilicon film forming gate electrode 123a is formed at a film formation temperature of 640° C. or more, preferably 650° C. or more. In addition, in a preferable embodiment, the atmosphere pressure in depositing a polysilicon film serving as a gate electrode may be in a range of 20 to 200 Torr.

In this embodiment, a single-wafer processing LPCVD apparatus is used. In the present invention, however, a batch processing LPCVD apparatus usually employed in manufacturing a semiconductor device, may be used.

By using the batch processing LPCVD apparatus, the polysilicon film serving as the gate electrode was formed, at a temperature from 500° C. to 630° C. and a pressure from 0.3 Torr to 1 Torr while SiH$_4$ gas is supplied at a flow rate from 200 sccm to 1000 sccm. As a result, the polysilicon film formed at a temperature of 580° C. or more was crystallized. At this time, the film stress was −300 MPa or less (300 MPa or less in terms of absolute value).

The results for the MOS capacitor manufactured by the batch processing LPCVD apparatus were the same as those of the MOS capacitor manufactured by the single-wafer processing LPCVD apparatus. That is, the total charge amount Qbd causing dielectric breakdown of the gate insulating film was about 15 C/cm$^2$. Furthermore, the silicon film deposited at a film formation temperature of 580° C. or less is in an amorphous state and has a compressive film stress of about −300 MPa. The amorphous film is crystallized into a polysilicon film in the annealing step performed later. The film stress of the polysilicon film greatly increases to a tensile stress of about 300 MPa in absolute value. When such a polysilicon film is used, the total charge amount of the gate insulating film comes to about 15/cm$^2$. The MOS capacitor manufactured by the batch processing LPCVD apparatus satisfies the same relationship between the total charge amount Qbd of the gate insulating film and the film stress of the gate electrode shown in FIGS. 3 and 6.

The same results as in the aforementioned embodiment are given in the case where MOS capacitor having a polysilicon film doped with phosphorus (P) or boron (B) is used in place of the film doped with arsenic (As). Furthermore, even if the concentration of the dopant is varied, the same results are obtained. Thus, it has been found that the film stress of a gate electrode is determined mainly by its film formation temperature, regardless of dopant materials or dopant concentration.

The gate insulating film of 8 nm thick is used in this embodiment. When the film thickness of the oxide film is changed, the total charge amount of the gate insulating film varies, accordingly. When the film thickness of the gate insulating film decreases, the total charge amount Qbd reduces, whereas when the film thickness increases, the total charge amount Qbd increases. However, the relationship between the film stress and the total charge amount of the gate insulating film is unchanged. That is, when the film stress of the gate electrode increases, the total charge amount of the gate insulating film decreases. To be more specific, when the film stress is 200 MPa or less, the total charge amount Qbd is about twice as large as that obtained at the film stress of 300 MPa.

In the case where the gate electrode is formed of another substance such as a metal including tungsten (W), the effect of the film stress upon the total charge amount Qbd of the gate insulating film is similar and thus, the same phenomenon is observed. Hence, when the metal electrode is used, it is effective to set the film stress of the gate electrode at 200 MPa or less in terms of absolute value, in order to improve the total charge amount Qbd of the gate insulating film, in other word, to improve reliability thereof.

Figure 7:
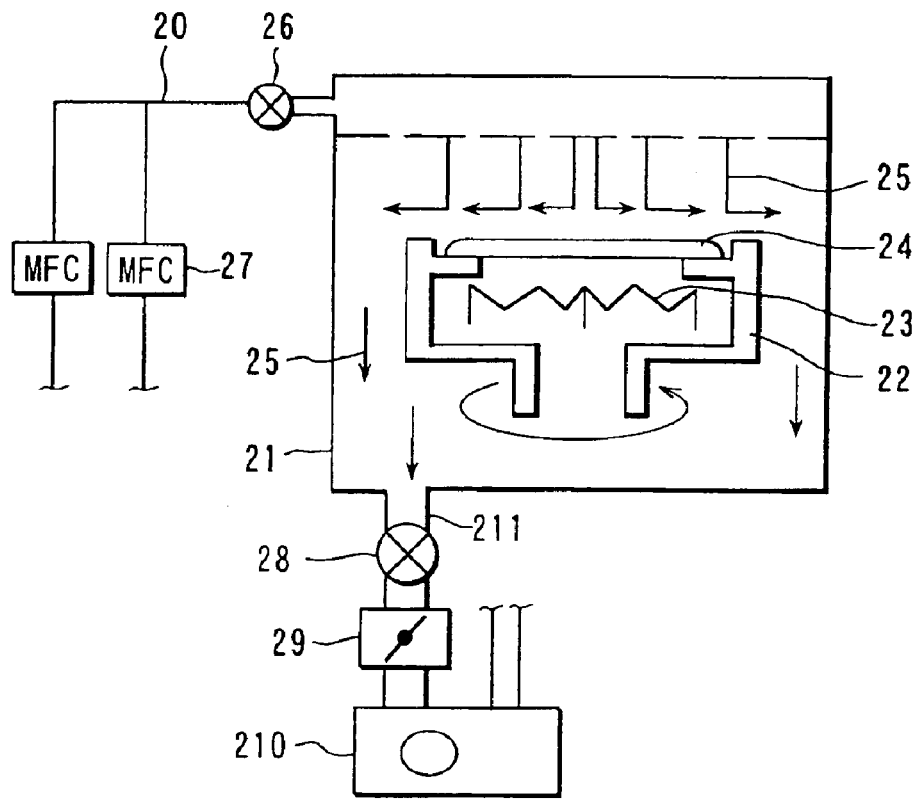
FIG. 7 is a schematic sectional view of a single-wafer processing LPCVD apparatus used in a second embodiment.

Referring to FIG. 7, a second embodiment will be explained.

In the first embodiment, a single-wafer processing LPCVD apparatus is used. When the single-wafer processing LPCVD apparatus is heated at high temperatures, the formed film is sometimes degraded in uniformity in thickness. To maintain the uniformity of film thickness, the semiconductor wafer is rotated in the apparatus.

FIG. 7 is a schematic sectional view of the single-wafer processing LPCVD apparatus. As shown in the figure, the LPCVD apparatus has a reaction chamber (film formation chamber) 21. In the film formation chamber 21, a wafer holder 22 is provided for mounting a semiconductor wafer 24 thereon. The wafer holder 22 is designed so as to rotate at a predetermined rotation number to rotate the semiconductor wafer 24. The film formation chamber 21 has a heater 23 therein for heating an inner space during film formation time. A reactive gas is supplied to the inner space of the film formation chamber 21 from a pipe 20 while being controlled by a mass-flow controller 27 and a valve 26. After completion of a reaction, an exhaust gas is discharged through a pipe 211 by a pump 210. The pump 210 is controlled by a valve 28 and a conductance valve 29.

A gas flow 25 of the reactive gas supplied through the pipe 20 enters from an upper portion of the film formation chamber 21, passes through slits and is supplied uniformly over a surface of the semiconductor wafer 24 in rotation. After completion of a reaction, the gas flow 25 is discharged from the pipe 211.

A semiconductor wafer was placed in the single-wafer processing LPCVD apparatus thus constructed and a reactive gas flow was supplied uniformly over the surface of the semiconductor wafer while the semiconductor wafer was rotated at a high speed. In this manner, a polysilicon film was formed on a semiconductor wafer. When the polysilicon film was formed by supplying $SiH_4$ at a flow rate of 1 SLM, $ASH_3$ at a flow rate of 3 sccm under a pressure of 50 Torr, and $N_2$ at a flow rate of 30 SLM, while the semiconductor wafer was rotated at a rotation number of 3000 rpm, the resultant polysilicon film was excellent in uniformity (±3% or less) in thickness within the semiconductor wafer surface plane at the film formation temperature ranging from 600° C. to 900° C. In this case, the film stress of the polysilicon film satisfied the same relationship between the film formation temperature and the film stress shown in FIG. 3. Then, MOS capacitors were formed on a semiconductor substrate and a total charge amount Qbd determining dielectric breakdown of the gate insulating films of the capacitors was examined and measured. The results are the same as shown in FIG. 6. That is, according to the second embodiment, it is possible to provide a semiconductor device having a highly liable gate insulating film, with keeping a very preferable uniformity in film thickness.

Now, referring to FIG. 8, a third embodiment will be explained.

Figure 8:
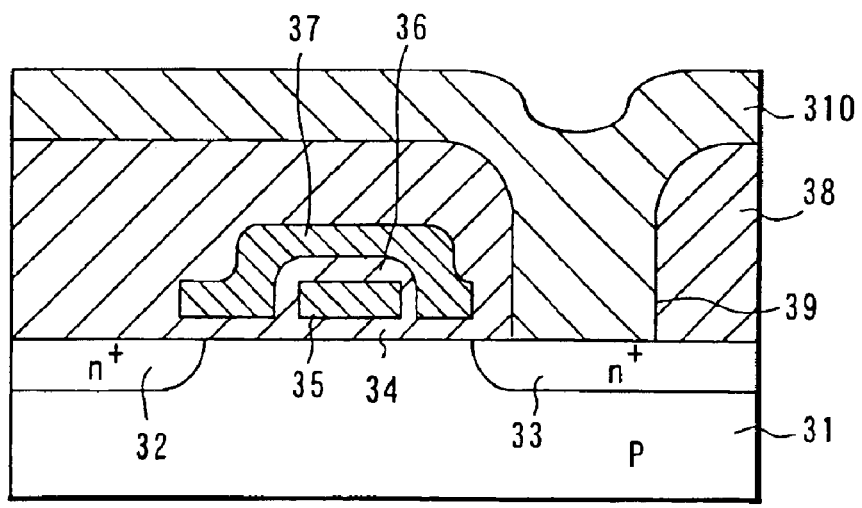
FIG. 8 is a cross sectional view of EEPROM according to a third embodiment.
Figure 9A:
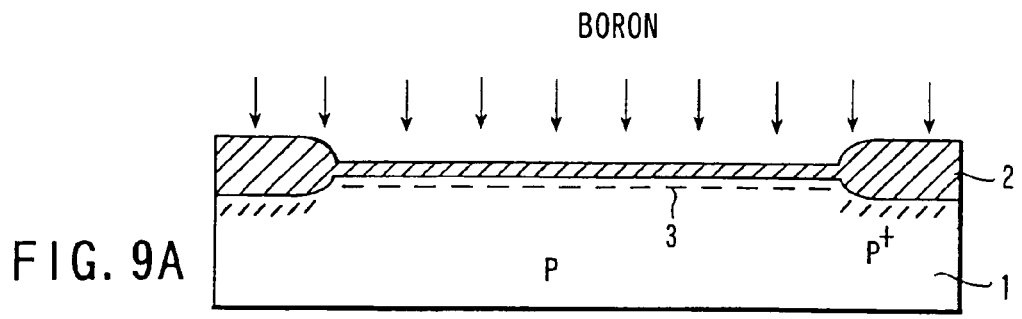
FIGS. 9A and 9B are cross sectional views showing manufacturing steps of a semiconductor substrate having a conventional MOS transistor.
Figure 9B:
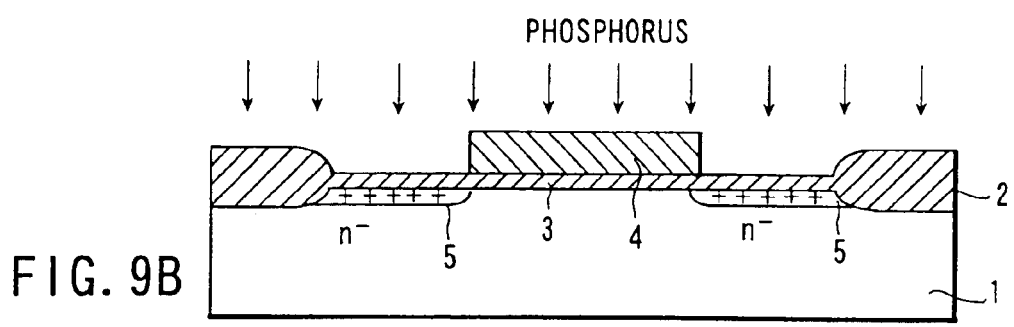
Figure 10A:
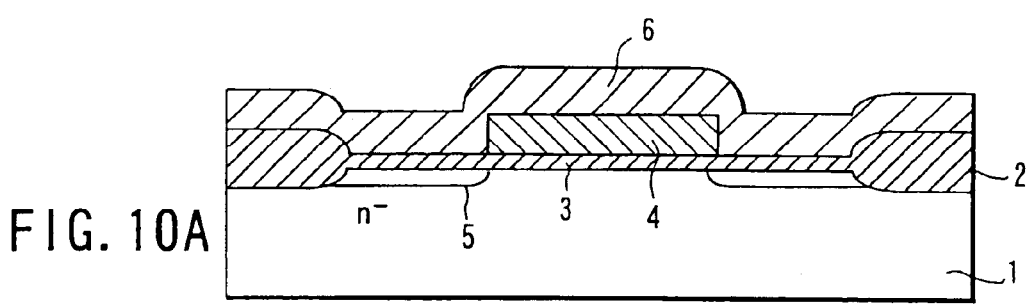
FIGS. 10A and 10B are cross sectional views showing the manufacturing steps of a semiconductor substrate having a conventional MOS transistor.
Figure 10B:
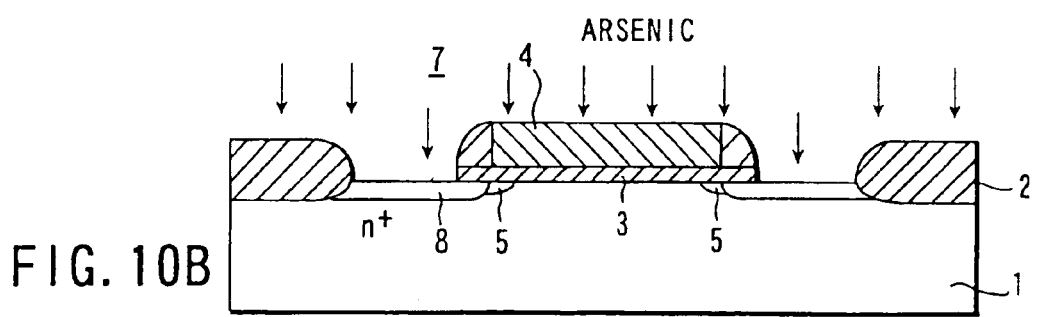

FIG. 8 is a cross sectional view of an EEPROM memory cell according to the third embodiment of the invention. The EEPROM is a non-volatile electrically erasable and programmable memory, and mostly used in a new fields including a logic array capable of programming data memory and logic in a logic circuit, e.g., a micro computer, data memories, and program memories of IC cards.

As the semiconductor substrate, for example, a p-type semiconductor substrate 31 is used. The surface of the semiconductor substrate 31 is oxidized with $O_2$, $H_2O$, or HCl gas at a temperature of 800° C. to form a thermal oxide film 34 of 8 nm thick serving as a gate insulating film.

Thereafter, the semiconductor substrate 31 is placed as a semiconductor wafer in the film formation chamber of the LPCVD apparatus shown in FIG. 1. A polysilicon film 35 constituting a floating gate is formed on the semiconductor wafer of about 200 nm thick at a film formation temperature of 680° C. while $SiH_4$ gas is supplied at a flow rate of 1 SLM and $AsH_3$ gas at 1 sccm under a pressure of 5 Torr. The film stress of polysilicon film 35 can be suppressed less than about 200 MPa in its absolute value by forming polysilicon film in the same manner as above the first embodiment or the second embodiment. As a result the polysilicon film 35 constituting a floating gate can have a total charge amount Qbd as twice large as a conventional one, so that a semiconductor device having a highly liable floating gate can be provided.

At this time, arsenic (As) is introduced into the polysilicon film 35 in an amount of about $1 \times 10^{20}$ atoms/cm$^3$. Thereafter, the polysilicon film 35 is annealed at 900° C. for 30 minutes under a $N_2$ atmosphere in order to activate a dopant.

Subsequently, a photoresist (not shown) is coated onto the polysilicon film 35 and photolithographically patterned. The resultant polysilicon film 35 is etched by a RIE method to form a floating gate 35 of polysilicon. Then, an interlayer insulating film ($SiO_2$) film 36 is formed on the semiconductor wafer by a CVD method so as to cover the floating gate 35. Subsequently, a polysilicon film 37 is formed on the semiconductor wafer of about 200 nm thick, for example, in the LPCVD apparatus shown in FIG. 1, in the same conditions as in the formation time of the floating gate 35. At this time, Arsenic (AS) is introduced into the polysilicon film 37 in an amount of about $1 \times 10^{20}$ atoms/cm$^3$. Thereafter, the polysilicon film 37 is annealed at 900° C. under a $N_2$ atmosphere in order to activate a dopant. Thereafter, a photoresist (not shown) is coated onto the polysilicon film 37 and photolithographically patterned. The polysilicon film 37 is etched by RIE to form a control gate 37 of polysilicon.

Note that the single-wafer processing LPCVD apparatus shown in FIG. 1 is used in this case, however, the polysilicon film forming the gate electrode may be formed in the single-wafer processing LPCVD apparatus shown in FIG. 7.

Then, n-type impurity ions such as boron are doped in the semiconductor substrate 31 by using the control gate 37 as a mask and thermally diffused to form an n+ source region 32 and an n+ drain region 33. Then, an insulating film (SiO$_2$) 38 is deposited by the CVD method on the semiconductor substrate 31 so as to cover the control gate 37. The surface of the insulating film 38 is planarized by a CMP (Chemical Mechanical Polishing) method. Then, a photoresist (not shown) is coated onto the insulating film 38 and photolithographically pattered. The resultant insulating film 38 is etched by RIE etc. to form a contact hole 38 through which the drain region 33 is exposed. Subsequently, an aluminium film 310 is deposited by a sputtering method on the insulating film 38 and within the contact hole 39, and photolithographically patterned to form a metal wiring 310.

As for the device such as EEPROM for writing data into a memory cell by using a tunnel current, the Qbd value is significant since it determines how many times the device can be programmed. Therefore, it is necessary to increase the total charge amount Qbd in order to improve the performance of the device. In the EEPROM in which the total amount Qbd of the electric charge passing through the gate insulating film directly influences upon characteristics of a device, the number of times the device can be programmed or rewritten is greatly improved by the present invention. Since the film stress of the gate electrode according to the present invention is suppressed to 200 MPa or less in terms of absolute value, the total charge amount Qbd of the gate insulating film increases nearly double. As a result, the life spans of transistors and LSI products having the MOS structure increase double, increasing reliability of the device. This feature is particularly useful in EEPROM in which the total charge amount Qbd directly influences upon characteristics of a device, since the number of times the device can be programmed or rewritten increases approximately double.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming source/drain regions in a surface of a semiconductor substrate;

forming a gate insulating film on a surface of the substrate between the source/drain regions; and forming a gate electrode on the gate insulating film, the gate electrode being set to have a film stress of 200 MPa or less in terms of absolute value, such that a total charge amount is 25 C/cm$^2$ or more, the total charge amount being an amount of electric charge passing through the gate insulating film when intrinsic dielectric breakdown of the gate insulating film takes place.

2. The method according to claim 1, wherein the gate electrode comprises a polysilicon film doped with an impurity.

3. The method according to claim 2, wherein the gate electrode consists essentially of the polysilicon film.

4. The method according to claim 2, wherein the film stress is a compressive stress.

5. The method according to claim 1, wherein the gate insulating film comprises a silicon oxide film.

6. The method according to claim 5, wherein the gate insulating film consists essentially of the silicon oxide film.

7. The method according to claim 6, wherein the gate insulating film has a property such that the total charge amount is 25 C/cm$^2$ or more when the gate insulating film has a thickness of 8 nm and is supplied with an electric field of 12 MV/cm.

8. The method according to claim 2, wherein the polysilicon film is formed by means of a CVD process performed at a film formation temperature of 640° C. or more.

9. The method according to claim 8, wherein the film formation temperature is 650° C. or more.

10. The method according to claim 8, wherein the semiconductor substrate is rotated at a rotational speed of 3000 rpm or more during the CVD process.

* * * * *

UNITED STATES PATENT AND TRADEMARK OFFICE
CERTIFICATE OF CORRECTION

PATENT NO. : 6,929,991 B2
DATED : August 16, 2005
INVENTOR(S) : Mikata et al.

It is certified that error appears in the above-identified patent and that said Letters Patent is hereby corrected as shown below:

Title page,
Insert Item -- [30] Foreign Application Priority Data
　　　　　　　　Dec. 15, 1998 (JP) .................. 10-375423 --.

Signed and Sealed this

Twenty-second Day of November, 2005

JON W. DUDAS
*Director of the United States Patent and Trademark Office*